(12) United States Patent
Lau et al.

(10) Patent No.: US 7,353,599 B2
(45) Date of Patent: Apr. 8, 2008

(54) FIDUCIAL MARKINGS FOR QUALITY VERIFICATION OF HIGH DENSITY CIRCUIT BOARD CONNECTORS

(75) Inventors: Edmond Warming Lau, Sunnyvale, CA (US); Xiaozhong Wang, Sunnyvale, CA (US); Robert Lewis Mosebar, San Jose, CA (US)

(73) Assignee: Emcore Corporation, Albuquerque, NM (US)

( * ) Notice: Subject to any disclaimer, the term of this patent is extended or adjusted under 35 U.S.C. 154(b) by 0 days.

(21) Appl. No.: 11/742,858

(22) Filed: May 1, 2007

(65) Prior Publication Data
US 2007/0200588 A1 Aug. 30, 2007

Related U.S. Application Data

(62) Division of application No. 11/240,402, filed on Sep. 30, 2005.

(51) Int. Cl.
*H05K 3/02* (2006.01)
*H05K 3/30* (2006.01)
*B02D 5/06* (2006.01)

(52) U.S. Cl. ............................ 29/846; 29/834; 427/834

(58) Field of Classification Search .................. 385/92; 361/777; 438/462; 29/829–831, 834, 846; 427/98.4, 282
See application file for complete search history.

(56) References Cited

U.S. PATENT DOCUMENTS

| | | | |
|---|---|---|---|
| 6,602,734 B1 * | 8/2003 | Wada et al. | 438/110 |
| 6,815,128 B2 * | 11/2004 | Rumsey et al. | 430/22 |
| 7,220,975 B2 * | 5/2007 | Koike et al. | 250/491.1 |
| 2005/0282360 A1 * | 12/2005 | Kida et al. | 438/462 |

* cited by examiner

*Primary Examiner*—Sung Pak
*Assistant Examiner*—Jerry T Rahll

(57) ABSTRACT

Methods for qualifying the accuracy of a circuit board may include providing a printing mask pattern for first and second sides of the circuit board with a first sequence of spaced indicia parallel to a first edge of the printed circuit board, and a second sequence of spaced indicia parallel to a second edge of the printed circuit board opposite the first edge. A layer of visually conspicuous material may be printed on the board using the mask patterns. The board may be separated or cut to a predetermined size thereby removing, at least a portion of the spaced indicia of each sequence. The number of indicia printed on the first and second sides respectively of the circuit board may be determined after the circuit board is cut to the predetermined size. The circuit board may be accepted or rejected based upon the numerical determination against a qualification criteria.

16 Claims, 12 Drawing Sheets

|  |  | RIGHT SIDE | | | | | |
|---|---|---|---|---|---|---|---|
|  |  | 0 | 1 | 2 | 3 | 4 | 5 |
| LEFT SIDE | 0 | BAD | BAD | BAD | BAD | BAD | BAD |
|  | 1 | BAD | BAD | BAD | GOOD | GOOD | BAD |
|  | 2 | BAD | BAD | GOOD | GOOD | GOOD | BAD |
|  | 3 | BAD | GOOD | GOOD | OPTIMUM | GOOD | BAD |
|  | 4 | BAD | GOOD | GOOD | GOOD | BAD | BAD |
|  | 5 | BAD | BAD | BAD | BAD | BAD | BAD |

TABLE 1

FIG.5

TABLE 2

| # OF MARKS | TOTAL WIDTH | METRIC | | LEFT SIDE | | | | | RIGHT MARK | | | | |
|---|---|---|---|---|---|---|---|---|---|---|---|---|---|
| | | DISTANCE TO THE LEFT EDGE | DISTANCE TO THE RIGHT EDGE | 0.1 | 0.1 | 0.05 | 0.05 | 14.5 | 14.5 | 0.05 | 0.05 | 0.1 | 0.1 |
| | | | | 1 | 2 | 3 | 4 | 5 | 5 | 4 | 3 | 2 | 1 |
| 4 | 29.10 | 0.85 | 0.45 | 0 | 0 | 0 | 1 | 1 | 1 | 1 | 0 | 0 | 0 |
| 4 | 29.10 | 0.90 | 0.40 | 0 | 0 | 1 | 0 | 1 | 1 | 0 | 0 | 0 | 0 |
| 4 | 29.10 | 0.80 | 0.50 | 0 | 0 | 0 | 1 | 1 | 1 | 1 | 1 | 0 | 0 |
| 5 | 29.15 | 0.90 | 0.45 | 0 | 0 | 1 | 1 | 1 | 1 | 1 | 0 | 0 | 0 |
| 5 | 29.15 | 0.85 | 0.50 | 0 | 0 | 0 | 0 | 1 | 1 | 0 | 1 | 0 | 0 |
| 5 | 29.20 | 0.80 | 0.60 | 0 | 0 | 1 | 1 | 1 | 1 | 1 | 1 | 0 | 0 |
| 5 | 29.20 | 1.00 | 0.40 | 0 | 1 | 1 | 1 | 1 | 1 | 0 | 0 | 1 | 0 |
| 6 | 29.20 | 0.90 | 0.50 | 0 | 0 | 1 | 1 | 1 | 1 | 1 | 1 | 0 | 0 |
| 6 | 29.25 | 0.85 | 0.60 | 0 | 0 | 0 | 1 | 1 | 1 | 1 | 1 | 1 | 0 |
| 6 | 29.25 | 1.00 | 0.45 | 0 | 1 | 1 | 1 | 1 | 1 | 1 | 0 | 1 | 0 |
| 7 | 29.30 | 0.90 | 0.60 | 0 | 0 | 1 | 1 | 1 | 1 | 1 | 1 | 1 | 0 |
| 7 | 29.30 | 1.00 | 0.50 | 0 | 1 | 1 | 1 | 1 | 1 | 1 | 1 | 0 | 0 |

FIG. 6

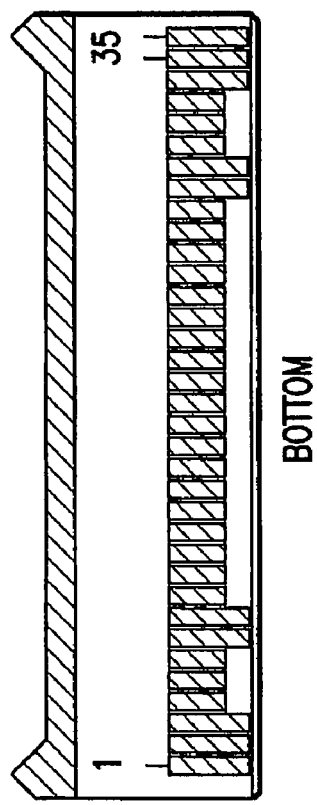
FIG.8(a) TOP
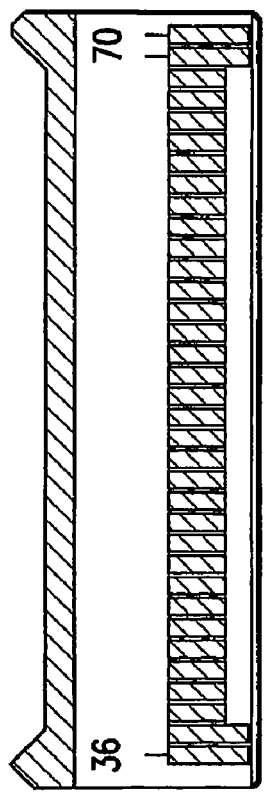
FIG.8(b) BOTTOM

BAD

GOOD

FIDUCIAL MARKINGS FOR QUALITY VERIFICATION OF HIGH DENSITY CIRCUIT BOARD CONNECTORS

This application is a divisional of application Ser. No. 11/240,402 filed Sep. 30, 2005, which in turn makes reference to U.S. patent application Ser. No. 11/240,400 to Whitehead, also filed on Sep. 30, 2005.

BACKGROUND OF THE INVENTION

1. Field of the Invention

The inventions relates to electro-optic conversion modules, and particularly to the use of fiducial markings on such printed circuit board electrical connectors used in circuit boards for verification of printing alignment, and fabrication accuracy and quality control.

2. Description of the Related Art

Optical data transmission networks provide high capacity signal transmission without many of the physical limitations of electrical cables. Fiber-optic transceivers used in such networks convert electrical signals into optical signals and vice versa at the interface of a fiber-optic cable and an electronic network unit, such as a computer or communications system.

The typical hardware design of some transceivers provides the use of a printed circuit board that terminate on one side with a cut out pin edge or a contact array forming a multi-pin electrical connector, which may be implemented on one or both sides of the board. With such a contact array, the circuit boards can be directly plugged into a mating receptacle on the back end of the host computer. The cut out connector may also be elongated, and sized to be able to extend through open slots in the back face of the computer chassis so that connection may be made to a receptacle mounted inside the chassis on a mother board of the computer.

To extend the application of the fiber optic transceiver for mass-produced, low-cost computer and communications devices, it is desirable for the individual components to be economical to fabricate, and thus the electrical connector to be simple and reliable at the same time. A number of industry standards have been defined to integrate some of these electrical connector design considerations into opto-electronic transceiver modules. For example, the XENPAK standard (see www.xenpak) describes an advantageous opto-electronic transceiver module package with a cut out printed circuit board electrical connector.

Like any lithographically printed circuit board, mask alignment and routing introduce variations from board to board that present issues of reliability and quality control, especially for high density pin configuration.

Prior to the present invention, there has not been a reliable process to ensure quality control in parallel optical module with a cut-out printed pin array electrical connector. Thus, it is desired to have a board design for the pin out making the electrical connection which can be easily checked to determine if it meets specification.

The novel features and characteristics of the invention are set forth in the appended claims. The invention itself, however, as well as other features and advantages thereof, will be best understood by reference to a detailed description of a specific embodiment, when read in conjunction with the accompanying drawings.

SUMMARY OF THE INVENTION

Briefly, and in general terms, the present invention provides a printed circuit board having a printed pattern of fiducial marks on a first side of the printed circuit board with a first sequence of spaced indicia parallel to a first edge of the board; and a second sequence of spaced indicia parallel to a second edge of the board opposite said first edge.

In another aspect, the present invention further provides a printed pattern of fiducial marks on a second side of the printed circuit board; including a third sequence of spaced indicia parallel to a first edge of the board, and a fourth sequence of spaced indicia parallel to a second edge of the board opposite said first edge.

In still another aspect, the present invention provides a planar circuit board having a first edge, a second edge opposite said first edge, and a third edge extending between said first and second edge; a printed circuit pattern imprinted on said circuit board including a plurality of connector contact areas extending along said third edge and a plurality of fiducial marks extending in a first row from said third edge along said first edge and in a second row from said third edge along said second edge.

In a further aspect, the present invention provides an optical transceiver for converting and coupling an information-containing electrical signal with an optical fiber having a housing including a fiber optic connector adapted for coupling with an external optical fiber for transmitting and/or receiving an optical communications signal; a rigid printed circuit board in the housing including a first edge forming a connector for coupling with an external electrical cable or information system device and for transmitting and/or receiving an information-containing electrical communications signal; and a pattern of fiducial marks on second and third opposed edges of said circuit board for assuring the accuracy and alignment of the electrical contacts of said connector.

In another aspect, the invention provides a method of qualifying the accuracy of a printed and cut printed circuit board by providing a printing mask pattern for a first side of the printed circuit board with a first sequence of a spaced indicia parallel to a first edge of the board; and a second sequence of spaced indicia parallel to a second edge of the board opposite said first edge; providing a printing mask pattern for a second side of the printed circuit board with a first sequence of spaced indicia parallel to a first edge of the board; and a second sequence of spaced indicia parallel to a second edge of the board opposite said first edge; printing a layer of visually conspicuous material on a printed circuit board using said mask patter; determining the number of indicia printed on said first and second sides respectively of a printed board; and based upon such numerical determination against a predetermined qualification criteria, accepting or rejecting the board.

BRIEF DESCRIPTION OF THE DRAWINGS

FIG. 5 is a table illustrating a typical evaluation criteria for specifying the quality of a printed circuit board based upon the number of fiducial marks appearing on the left and right edge of the board;

FIG. 6 is a more detailed table providing evaluation criteria for the specific example XENPAK board according to the preferred embodiment;

FIGS. 8a and 8b are enlarged top and bottom plan view respectively of the printed circuit board connector of FIG. 7;

DESCRIPTION OF THE PREFERRED EMBODIMENT

Figure 1:
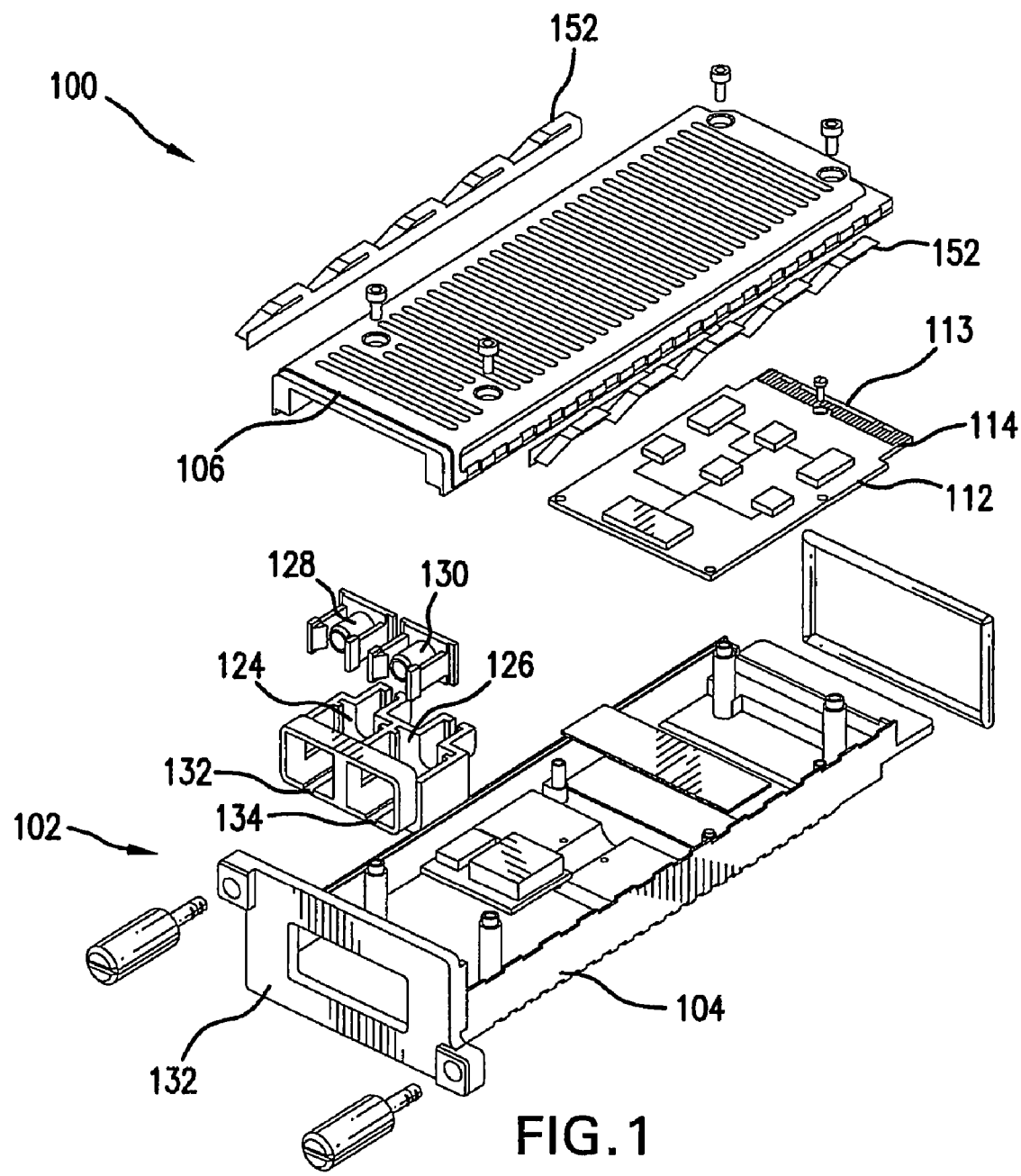
FIG. 1 is an exploded perspective view of an optical transceiver incorporating the cut out printed circuit board according to the present invention.

Details of the present invention will now be described, including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of actual embodiments or the relative dimensions of the depicted elements, and are not drawn to scale.

FIG. 1 is an exploded perspective view of an optical transceiver 100 incorporating the cut out printed circuit board with fiducial marks according to the present invention. In this particular embodiment, the transceiver 100 is compliant with the IEEE 802.3ae 10GBASE-LX4 Physical Media Dependent sub-layer (PMD) and the XENPAK (TM) form factor. It is to be noted, however, that the transceiver 100 may be configured to operate under various other compliant protocols (such a Fibre Channel or SONET) and be manufactured in various alternate form factors such as X2. The transceiver 100 is preferably a 10 Gigabit Coarse Wavelength Division Multiplexed (CWDM) transceiver having four 3.125 Gbps distributed feedback lasers and provides 300 meter transmission over legacy installed multimode fiber and from 10 to 40 km over standard single mode fiber.

The transceiver 100 includes a two-piece housing 102 with a base 104 and a cover 106. In addition, contact strips 152 are provided to ground the module to chassis ground as well. The housing 102 is constructed of die-cast or milled metal, preferably die-cast zinc, although other materials also may be used, such a specialty plastics and the like. Preferably, the particular material used in the housing construction assists in reducing EMI. Further, EMI reduction may be achieved by using castellations (not shown) formed along the edges of the housing 102.

The front end of the transceiver 100 includes a faceplate 132 for securing a pair of receptacles 124, 126. The receptacles 124, 126 are configured to receive fiber optic connector plugs 128, 130. In the preferred embodiment, the connector receptacle 128, 130 are configured to receive an optical fiber with industry standard SC duplex connectors (not shown). As such, keying channels 132 and 134 are provided to ensure that the SC connectors are inserted in their correct orientation. Further, as shown in the exemplary embodiment and discussed further herein, the connector receptacle 126 receives and SC transmitting connector and the connector plug 124 receives an SC receiver connector.

In particular, the transceiver housing holds one or more circuit boards, including a transmit receive and a physical coding sub-layer subassemblies, and interface board 112, which is used to provide an electrical interface to external electrical systems (not shown).

The rear edge 113 of the board 112 includes a printed pattern of contact points 114 which form individual electrical connections to an external mating receptacle on the external system which the transceiver is associate with. The size and number of pins depends upon the particular standard. In the preferred embodiment, the 70 pm board edge connector as set forth in the XENPAK and X2 Multi-Source Agreements is depicted in FIGS. 7 and 8.

Figure 2:
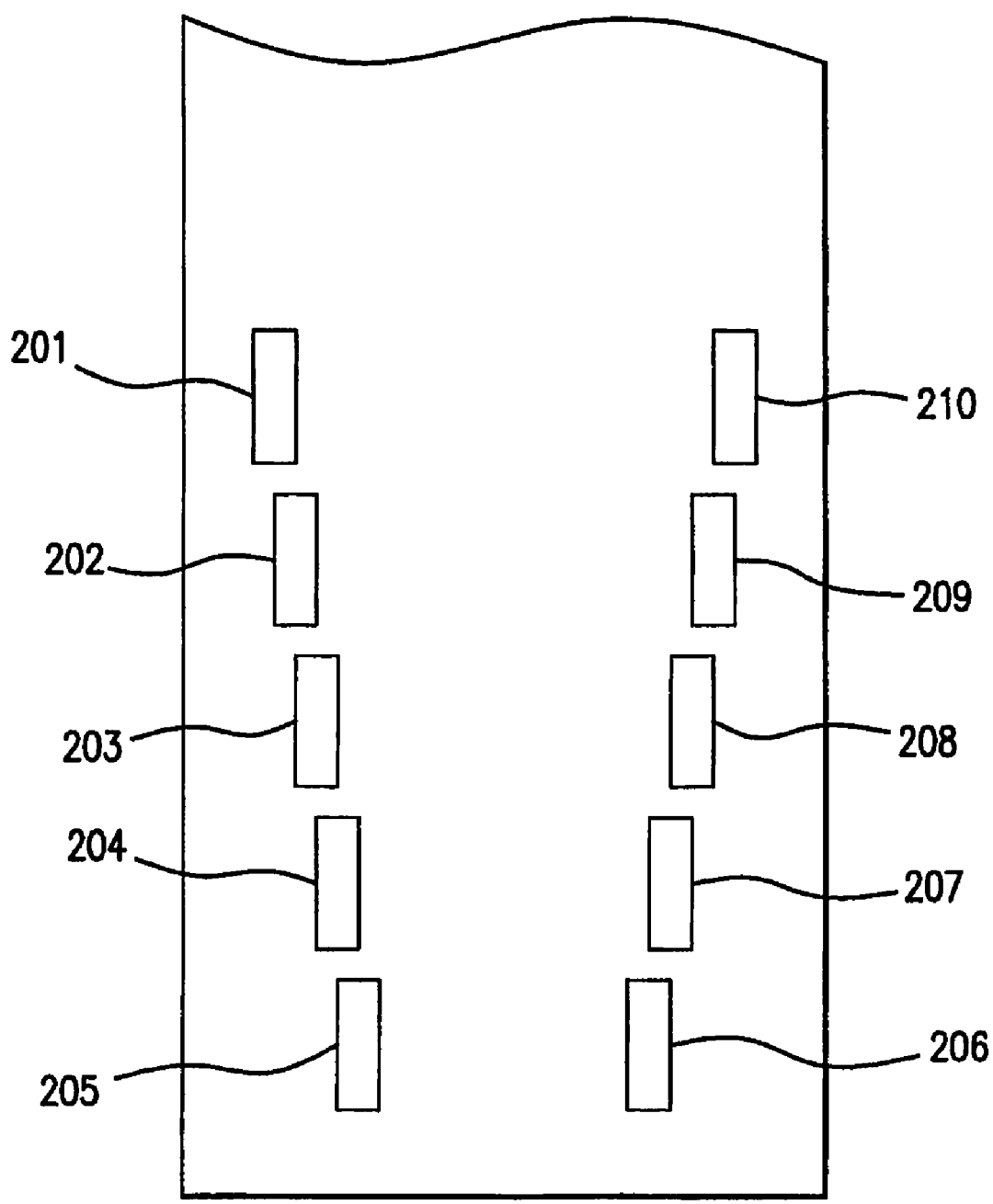
FIG. 2 is the mark pattern of fiducial indicia used for printing a printed circuit board according to the present invention.

FIG. 2 is the mark pattern of fiducial indicia 201 through 210 used for printing a single printed circuit board according to the present invention. In an actual production process, a number of identical printed circuit boards will be laid out in an array on a panel and printed simultaneously, as will be seen with reference to FIG. 3(b). After the single panel is printed, the individual boards are then separated or cut out with a router or other process equipment.

Figure 3A:
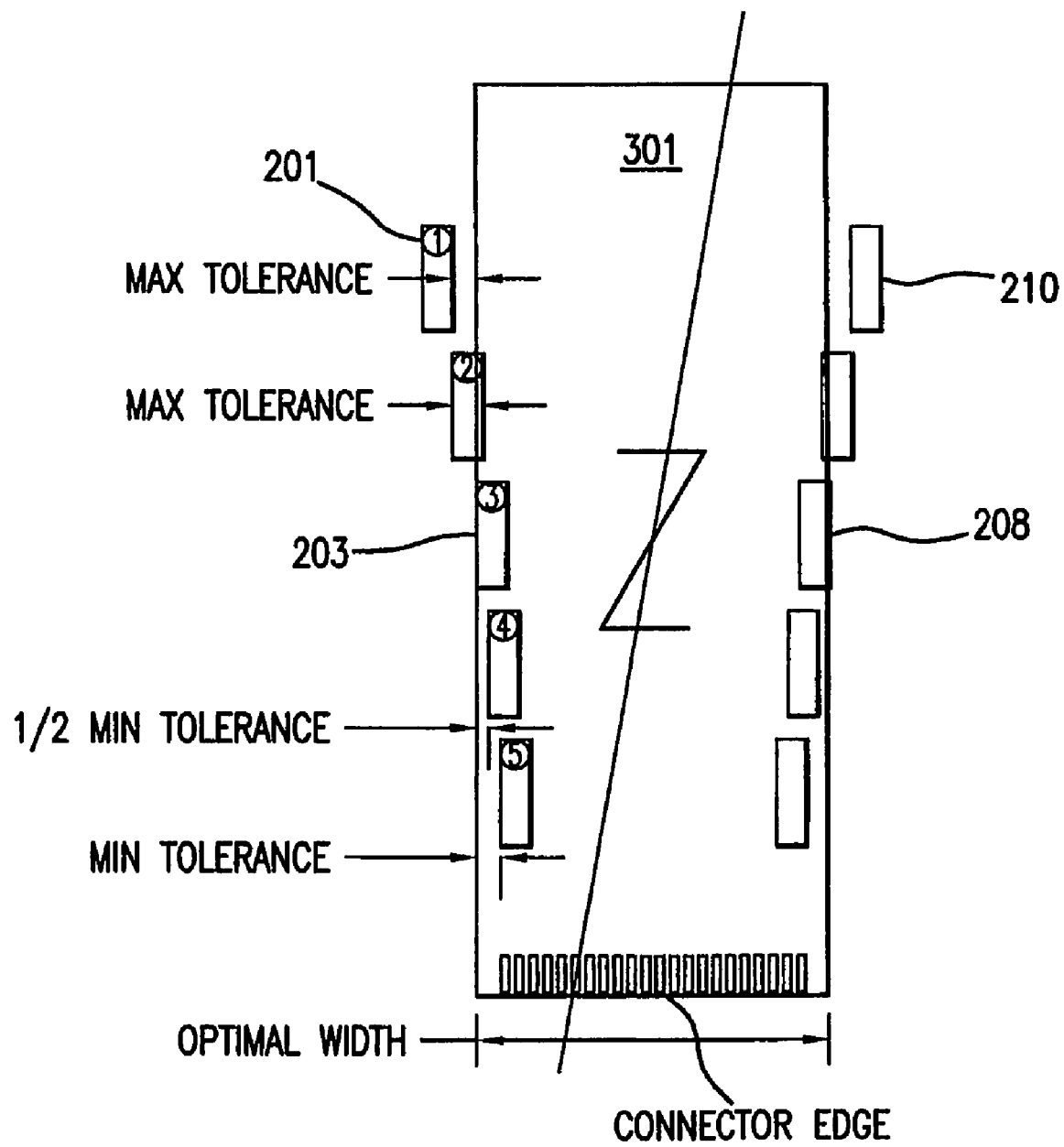
FIGS. 3a and 3b depict an overlay of the mark pattern of FIG. 2 over a portion of a printed circuit board which is sized with an optimum width in both single board and multiple board panel views respectively.

FIG. 3(a) depicts an overlay of the mark pattern of FIG. 2 over a printed circuit board 301 which is sized with an optimum width with respect to the pattern of fiducial marks, and routed with respect to the marks in a an optimum or ideal manner. In particular, the outside edges of marks 203 and 208 define the optimum or ideal width and the routing or cutting of the board or aligned and parallel to the outer edge of marks 203 and 208.

Figure 3B:
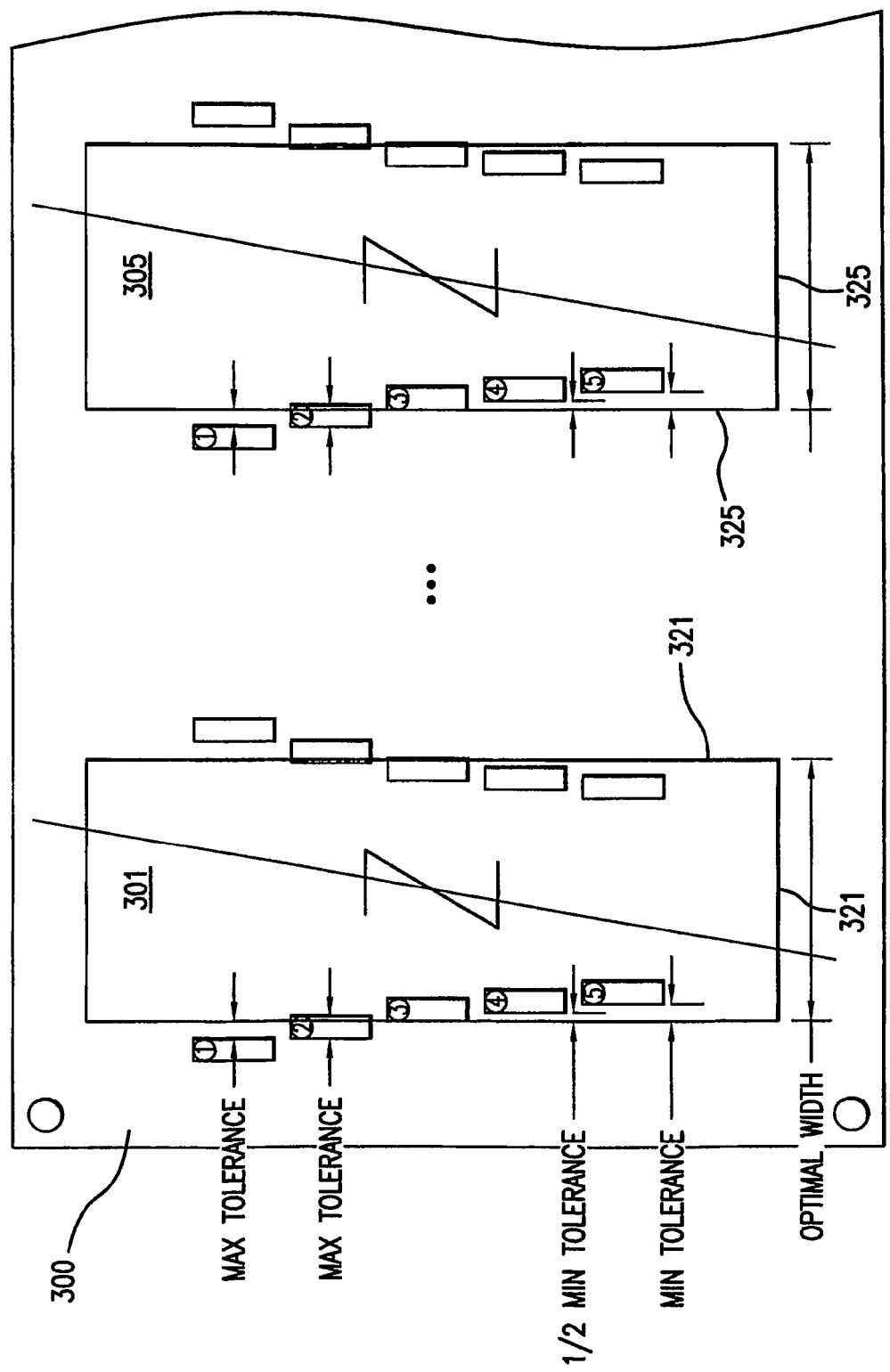

FIG. 3(b) depicts a printed circuit panel 300 from which individual printed circuit boards 301, 305, etc. are routed or cut along lines 321, 325, etc. It is seen that the masking pattern depicted in FIG. 2 overlies the size of a single board, with the more extreme marks 201 or 210 being printed on the panel portion which is normally cut away.

Figure 4C:
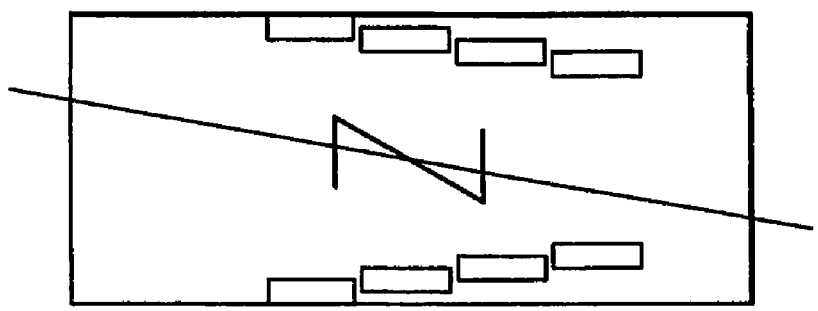
FIGS. 4a, 4b and 4c depict these different production printed circuit boards with different patterns of fiducial indicia present on them.
Figure 4B:
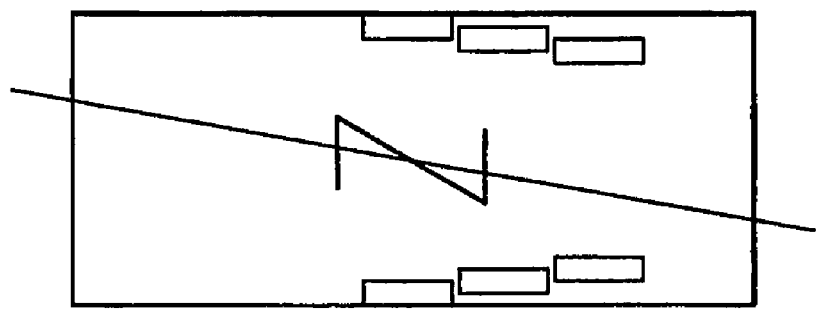
Figure 4A:
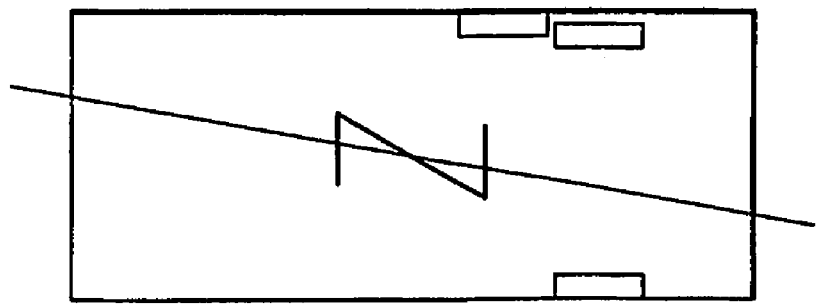

FIGS. 4a, 4b and 4c depict three different specimens of production printed circuit boards with different fiducial indicia present on them as illustrative examples of different printing patterns which may be printed as a result of differences in alignment or routing of the individual boards during a production process.

FIG. 5 is a table illustrating the evaluation criteria for specifying the quality of a printed circuit board based upon the number of fiducial marks appearing on the left and right edge of the board as determined from human visual or automated computer inspection process. In this particular example, the criteria rates the board as either optimum, good or bad.

FIG. 6 is a more detailed table providing a more detailed evaluation of the optimum or good boards for the specific dimensions of the XENPAK X2 specification. The fiducial marks are numbered 1 through 5 with the 5 mark closest to the pin connector edge of the board. In each row, the digit 1 in the row represents the presence of the specifically numbered mark on the sample board defined by the row, and the digit 0 in the row represents the absence of a board with marks 4 and 5 on the left side, and 4 and 5 on the right side, for a total of four marks, as noted in column 1. The width of the board is then determined in column 2, and the distances to the left and right edges of the board set forth in column 3 and 4 respectively.

Figure 7A:
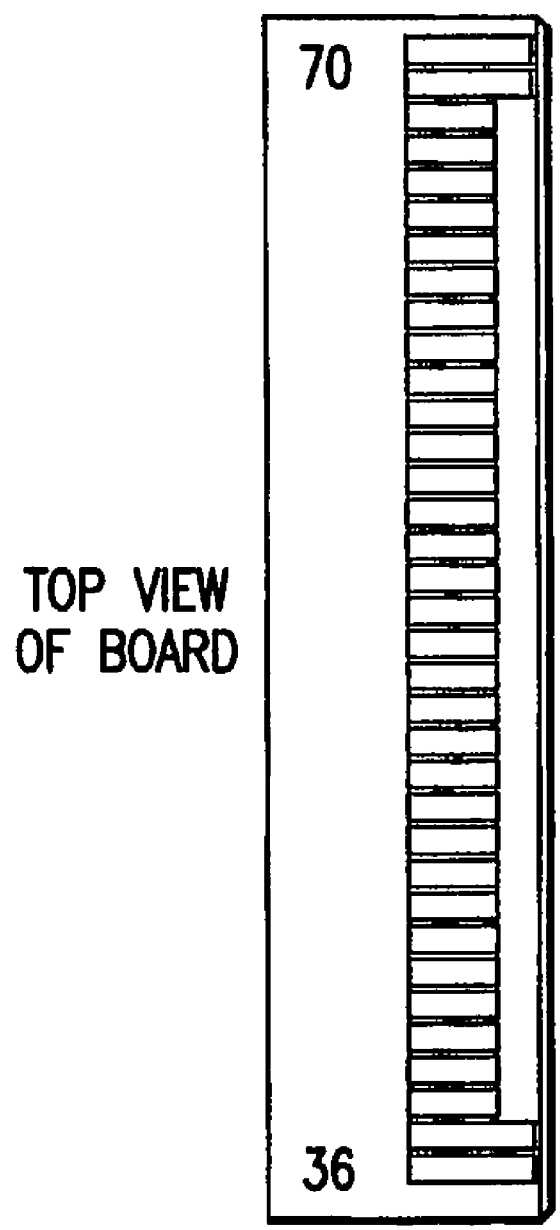
FIGS. 7a, 7b and 7c are printed circuit board connector specifications according to the XENPAK standard.
Figure 7C:
Figure 7B:
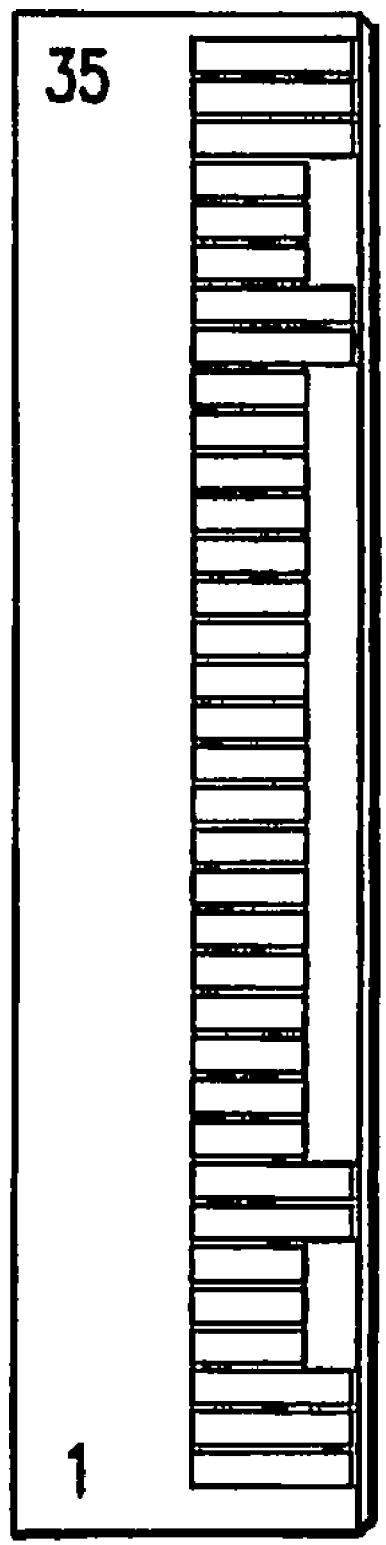

FIGS. 7a, 7b, and 7c are printed circuit board connector specifications according to the XENPAK standard.

FIGS. 8a and 8b are enlarged top and bottom plan views respectively of the printed circuit board connector of FIG. 7.

Figure 9A:
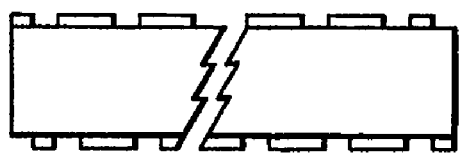
FIGS. 9a and 9b are cross-sectional view of two different production printed circuit boards.
Figure 9B:
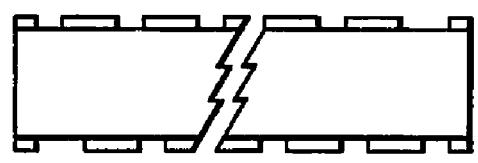

FIGS. 9a and 9b are cross-sectional views of two different production printed circuit boards to illustrate how the printing on the first and second sides of the board may result in a relative misalignment of the pin patterns on the top and bottom. In the examples illustrated, note the metallization on the left hand edge on both the top and bottom of the board. In the FIG. 9(a) production specimin, the metallization does not extend to the edge. Thus, the unit of FIG. 9(a) is misaligned and should be rejected, while the unit of FIG. 9(b) is acceptable.

Figure 10:
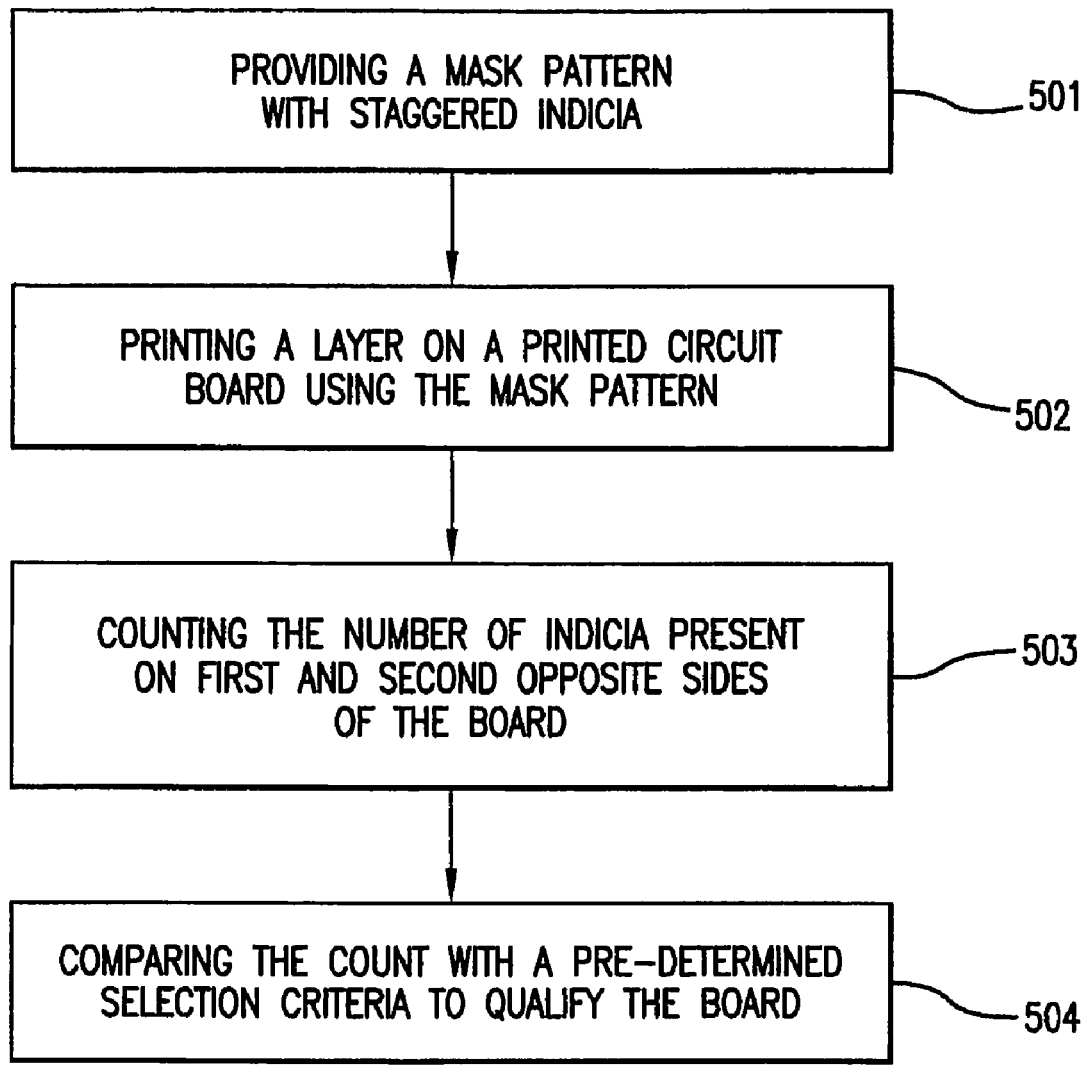
FIG. 10 is a flow chart depicting the method of using the fiducial marks according to the present invention in a quality control protocol.

FIG. 10 is a flow chart depicting the method of using the fiducial marks according to the present invention in a quality control protocol.

In the highly simplified method, the first step 501 is to provide a mask pattern with fiducial marks on indicia that are arrayed in parallel in a staggered sequence of steps diverging away from the edge where the pin contacts are to be printed.

In the next step 502, a layer is printed on the printed circuit board (or on the panel of several boards) including the fiducial marks. Typically, the fiducial marks may be the same metal layer as the pin contacts, so only a single print step is involved for each side of the board. Following printing, the individual boards may be separated or routed from the panel.

The next step 503 is to count the indicia on the first and second opposite edges of the board, on each side, and to utilize those numbers in the next step 504 to qualify the board.

What is claimed is:

1. A method of qualifying the accuracy of a printed circuit board comprising:
   providing a printing mask pattern for a first side of the printed circuit board with a first sequence of spaced indicia parallel to a first edge of the printed circuit board, and a second sequence of spaced indicia parallel to a second edge of the printed circuit board opposite said first edge;
   printing a layer of visually conspicuous material on said first side of the printed circuit board using said printing mask pattern;
   separating or cutting the printed circuit board to a predetermined size thereby removing, at least a portion of some of said spaced indicia of each sequence;
   determining the number of indicia printed along said first edge and said second edge of the printed circuit board, after the printed circuit board is cut to said predetermined size; and
   based upon such numerical determination against a qualification criteria accepting or rejecting the printed circuit board.

2. The method as defined in claim 1, wherein the method of separating includes routing.

3. The method according to claim 1, comprising determining a separation or cutting boundary for said separating or cutting of the printed circuit board based on said printing mask.

4. The method according to claim 1, wherein at least a portion of said spaced indicia for said printing mask are arrayed in a staggered sequence of steps diverging away from an edge of the printed circuit board disposed between said first edge and said second edge.

5. A method of qualifying the accuracy of a printed circuit board comprising:
   providing a printing mask pattern for a first side of the printed circuit board with a first sequence of spaced indicia parallel to a first edge of the printed circuit board, and a second sequence of spaced indicia parallel to a second edge of the printed circuit board opposite said first edge;
   providing a printing mask pattern for a second side of the printed circuit board with a first sequence of spaced indicia parallel to said first edge of the printed circuit board, and a second sequence of spaced indicia parallel to a second edge of the board opposite said first edge;
   printing a layer of visually conspicuous material on the printed circuit board using said mask patterns;
   separating or cutting the printed circuit board to a predetermined size thereby removing, at least a portion of some of said spaced indicia of each sequence;
   determining the number of indicia printed on said first and second sides respectively of the printed circuit board after the printed circuit board is cut to said predetermined size; and
   based upon such numerical determination against a qualification criteria, accepting or rejecting the printed circuit board.

6. The method according to claim 5, comprising determining an optimal size for the printed circuit board, based on said determined number.

7. The method according to claim 6, wherein said optimal size comprises an optimal width of the printed circuit board, said optimal width corresponding to said determined number.

8. The method according to claim 5, wherein said first sequence of said plurality of spaced indicia and said second sequence of said plurality of spaced indicia for one or both of said first printing mask and said second printing mask comprise staggered indicia.

9. The method according to claim 5, wherein at least a portion of said spaced indicia for said first printing mask and said second printing mask are arrayed in a staggered sequence of steps diverging away from an edge of the printed circuit board disposed between said first edge and said second edge.

10. The method as defined in claim 5, wherein a plurality of printed circuit boards are implemented on a panel, and further comprising separating the printed circuit board from the panel prior to said determining step.

11. The method as defined in claim 5, wherein the method of separating includes routing.

12. The method according to claim 5, comprising determining a separation or cutting boundary for said separating or cutting of the printed circuit board based on said first printing mask and said second printing mask.

13. The method according to claim 5, wherein said qualification criteria is stored in a look-up table.

14. The method according to claim 5, wherein said determining step is performed via a human visual inspection or an automated computer inspection.

15. The method according to claim 5, wherein said determining step comprises determining the number of indicia appearing on said first edge and said second edge of the printed circuit board.

16. The method according to claim 5, wherein said layer of visually conspicuous material and a plurality of pin contacts are placed on the printed circuit board using a single printing step.

* * * * *